US006188343B1

(12) United States Patent
Smith

(10) Patent No.: US 6,188,343 B1
(45) Date of Patent: Feb. 13, 2001

(54) METHOD AND STRUCTURE FOR PROVIDING A DIGITALLY CONTROLLED VOLTAGE GAIN AMPLIFIER WITH NON-LINEAR GAIN ADJUSTMENTS

(75) Inventor: Steven O. Smith, Loveland, CO (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 09/064,369

(22) Filed: Apr. 21, 1998

(51) Int. Cl.[7] .......... H03M 1/66

(52) U.S. Cl. .......... 341/138; 341/147

(58) Field of Search .......... 341/144, 138, 341/147

(56) References Cited

U.S. PATENT DOCUMENTS 3,183,342 * 5/1965 Wortzman .......... 341/144
5,483,151 1/1996 Yamashita .......... 323/312

* cited by examiner

*Primary Examiner*—Howard L. Williams
(74) *Attorney, Agent, or Firm*—Skjerven Morrill MacPherson LLP.; Edward C. Kwok

(57) ABSTRACT

A non-linear function of an input voltage is provided by cascading multiplying digital-to-analog converters (mDACs) to provide a polynomial power series to approximate the non-linear function. Weighting functions are provided by fixed gain amplifiers.

13 Claims, 2 Drawing Sheets

METHOD AND STRUCTURE FOR PROVIDING A DIGITALLY CONTROLLED VOLTAGE GAIN AMPLIFIER WITH NON-LINEAR GAIN ADJUSTMENTS

BACKGROUND OF THE INVENTION

The present invention relates to digital voltage control. In particular, the present invention relates to using digital-to-analog converters to perform a power series approximation of a non-linear function of an input signal.

SUMMARY OF THE INVENTION

The present invention provides a method and a circuit for creating a non-linear function of an input voltage, based on a power series approximation. In one embodiment, a circuit of the present invention includes: (a) a first multiplying digital-to-analog converter (mDAC) receiving a reference voltage and a digital value, to provide a first output voltage proportional to the input reference voltage and the digital value; (b) a second mDAC receiving the first output voltage and the same digital value to provide a second output voltage proportional to the reference voltage and a square of said digital value; and (c) a summing circuit receiving the first and second output voltages and the reference voltage to provide a weighted sum of these voltages. Weighting factors can be provided by fixed gain amplifiers for each of the reference voltage, and the first and second output voltages, to create coefficients to better approximate the non-linear function. Additional higher order terms can be obtained by similarly cascading additional mDACs.

The present invention is better understood upon consideration of the detailed description below and the accompanying drawings.

DETAILED DESCRIPTION OF THE PREFERRED EMBODIMENTS

The present invention provides a method and a circuit for providing a non-linear function of an input signal, using a power series approximation.

Figure 1:
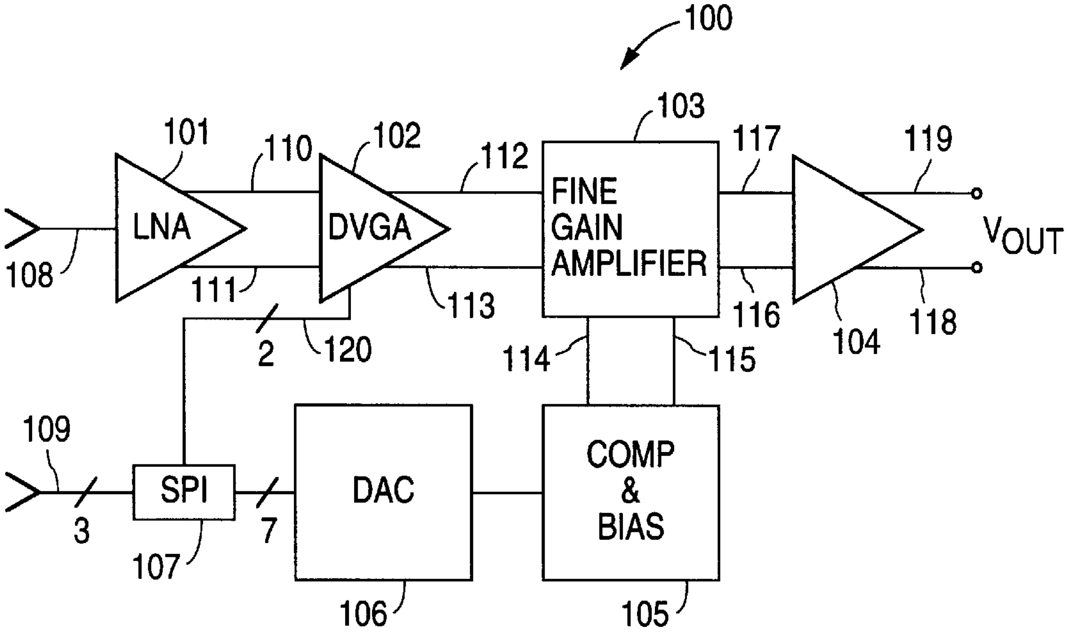
FIG. 1 shows a digitally-controlled voltage gain amplifier (DVGA) 100, to which the present invention is applicable.

One example circuit to which the present invention is applicable is a digitally-controlled voltage gain amplifier (DVGA) 100 shown in FIG. 1. As shown in FIG. 1, circuit 100 receives an analog input signal at terminal 108, a 3-bit digital control signal at terminal 109. The input signal at terminal 108 is preamplified and filtered by a low-noise amplifier 101 and converted from a single-ended signal to a differential signal across terminals 110 and 111. The differential signal is then amplified, as a coarse gain adjustment, by a digitally-controlled amplifier 102, according to a 2-bit digital signal provided on terminals 120. Digitally-controlled amplifier 102 provides a differential signal across input terminals 112 and 113 of a fine gain adjustment amplifier 103 to be adjusted according to a second differential input signal of fine gain adjustment amplifier 103 across terminals 114 and 115. Fine gain adjustment amplifier 103 provides an output differential signal across terminal 116 and 117, which is received by output amplifier 104 to provide an output differential signal across terminals 118 and 119.

The fine adjustment differential signal across terminals 114 and 115 is provided, after "trimming" by a compensation and bias circuit 105, by a digital-to-analog converter (DAC) 106. In this embodiment, compensation and bias circuit 105 converts the single-ended output signal of DAC 106 into a differential signal across terminals 114 and 115. DAC 106 receives a 7-bit input signal from serial-to-parallel converter 107 receiving the 3-bit digital control signal at terminals 109.

Figure 4:
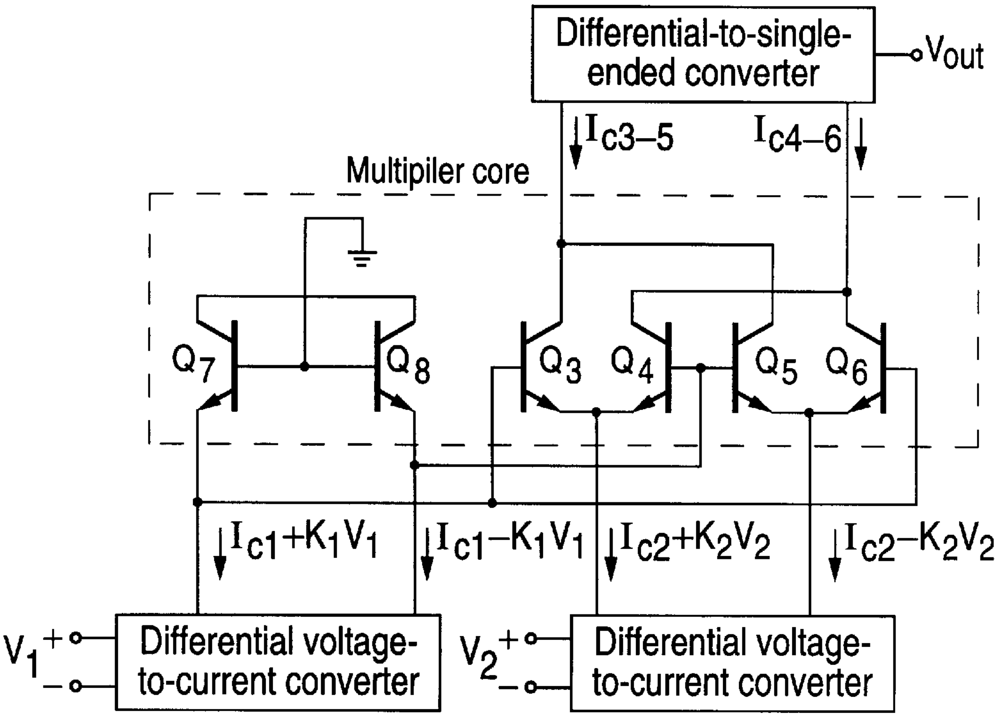
FIGURE 4 (PRIOR ART)
FIG. 4 shows Gilbert cell 400, which is an example of a four-quadrant multiplier suitable for use in circuit 100.

In one embodiment, the requirements on circuit 100 include (a) overall gain stability within a temperature range of −20° C. to 85° C.; and (b) the fine gain adjustments are to be specified in 0.1 dB steps. Since 0.1 dB steps are non-linear steps (in fact, exponential steps), one method to provide such non-linear adjustment steps uses a linear four-quadrant multiplier to perform the task of fine gain amplifier 103, while the four-quadrant multiplier is driven by a non-linear differential gain adjustment signal across terminals 114 and 115. One example of a four-quadrant multiplier suitable for this purpose is a Gilbert cell, illustrated by Gilbert cell 400 of FIG. 4 known in the art. The present invention provides the non-linear differential gain adjustment signal by generating a non-linear signal in D/A 106 using a power series. A power series is a polynomial function that can be used to represent many functions, including many transcendental functions. For example, the exponent function can be approximated by:

$$e^x = 1 + x + \frac{x^2}{2!} + \frac{x^3}{3!} + \ldots$$

Figure 2:
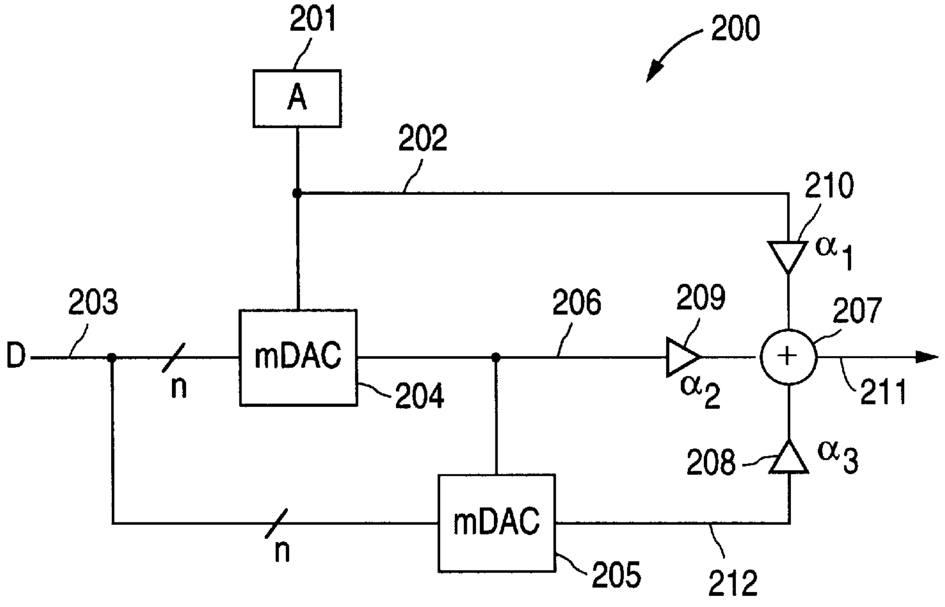
FIG. 2 is a block diagram of a circuit 200 which includes two cascaded multiplying digital-to-analog converters (mDACs) to generate a non-linear function, in one embodiment of the present invention.
Figure 3:
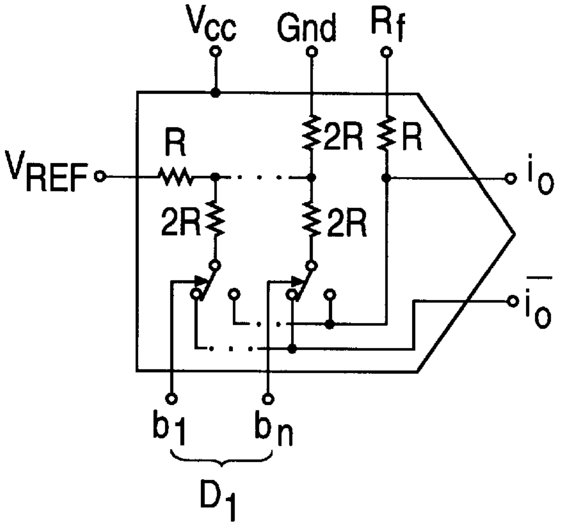
FIGURE 3 (PRIOR ART)
FIG. 3 shows schematic a multiplying digital-to-analog converter 300.

The present invention provides such a power series by cascading multiplying digital-to-analog converters (mDACs). A conventional mDAC 300 is shown functionally in FIG. 3. As shown in FIG. 3, mDAC 300 includes a conventional ladder network 301 for providing a conventional digital-to-analog signal conversion of a digital value provided at input terminals 302. An input reference voltage allows scaling of the output signal at terminal 303 to the input reference voltage. FIG. 2 shows cascading two mDACs to generate a non-linear function (in this instance, a second degree polynomial), in one embodiment of the present invention. As shown in FIG. 2, circuit 200 includes mDAC 204, which receives a reference voltage A from voltage source 201 at terminal 202, and an n-bit digital value D at bus 203, to provide an output analog signal at terminal 206. This output analog signal at terminal 206, which is also provided as an input reference voltage to mDAC 205, has a magnitude proportional to D*A. mDAC 205, which also receives the n-bit digital value D from bus 203, thus provides as output an analog output voltage proportional to D*D*A or $D^2A$. As shown in FIG. 2, the voltages A, DA and $D^2A$ at terminals 202, 206 and 212 are amplified by amplifiers 210, 209 and 208 of fixed gains $\alpha_1$, $\alpha_2$, and $\alpha_3$, respectively. These amplified voltages are summed by a conventional voltage summing circuit to provide a non-linear output voltage at terminal 211. In fact, the non-linear output voltage is a weighted sum of voltages A, DA and $D^2A$:

$V_{out}=a_1A+a_2DA+a_3D^2A$, where the weights $a_1$, $a_2$, $a_3$ are functions of gains $\alpha_1$, $\alpha_2$, and $\alpha_3$ respectively. Voltages corresponding to higher order polynomial functions of the digital value D can be obtained by similarly cascading additional mDACs.

The above detailed description is provided to illustrate specific embodiments of the present invention and is not intended to be limiting. Numerous variations and modification within the scope of the present invention are possible. The present invention is set forth in the following claims.

I claim:

1. A digitally-controlled voltage gain amplifier circuit capable of non-linear voltage adjustments, comprising:

a fine gain amplifier receiving an analog input signal and an analog gain adjustment signal to provide an output analog signal having a value that is a function of said analog input signal and said analog gain adjustment signal; and a gain control circuit receiving a digital value and providing said analog gain adjustment signal, said gain control circuit comprising:

a first multiplying digital-to-analog converter receiving a reference voltage and said digital value to provide a first output voltage proportional to said reference voltage and said digital value;

a second multiplying digital-to-analog converter receiving said first output voltage and said digital value to provide a second output voltage proportional to said reference voltage and a square of said digital value; and a summing circuit receiving said first and second output voltages and said reference voltage to provide a sum thereof as said analog gain adjustment signal.

2. A digitally-controlled voltage gain amplifier circuit as in claim 1, wherein said gain control circuit further comprising an amplifier amplifying said first output voltage by a predetermined factor prior to being provided to said summing circuit.

3. A digitally-controlled voltage gain amplifier circuit as in claim 1, wherein said gain control circuit further comprising an amplifier amplifying said second output voltage by a predetermined factor prior to being provided to said summing circuit.

4. A digitally-controlled voltage rain amplifier circuit as in claim 1, wherein said Rain control circuit further comprising an amplifier amplifying said reference voltage by a predetermined factor prior to being provided to said summing circuit.

5. A digitally-controlled voltage gain amplifier as in claim 1, wherein said fine gain amplifier comprises a four-quadrant multiplier.

6. A digitally-controlled voltage gain amplifier as in claim 1, wherein said gain control circuit further comprises a compensation and bias circuit to provide trimming to said analog gain adjustment signal.

7. A digitally-controlled voltage gain amplifier as in claim 5, further comprising means for converting said analog input signal into a differential signal.

8. A digitally-controlled voltage gain amplifier as in claim 5, further comprising means for converting said analog gain adjustment signal into a differential signal.

9. A method for providing a digitally-controlled voltage gain amplifier circuit capable of non-linear voltage adjustments, comprising:

(i) receiving an analog input signal;

(ii) receiving an input a digital value representative of a parameter one of said non-linear voltage adjustments;

(iii) generating from said digital value an analog gain adjustment, said generating comprises:

(a) providing a first multiplying digital-to-analog converter receiving a reference voltage and said digital value to provide a first output voltage proportional to said reference voltage and said digital value;

(b) providing a second multiplying digital-to-analog converter receiving said first output voltage and said digital value to provide a second output voltage proportional to said reference voltage and a square of said digital value; and (c) summing said first and second output voltages and said reference voltage to provide said analog gain adjustment signal; and (iv) amplifying said analog input signal according to said analog gain adjustment signal to provide an analog output signal.

10. A method as in claim 9, wherein said generating further comprising the step of providing a predetermined weight to each of said reference voltage, and said first and second output voltages.

11. A method as in claim 9, wherein said analog input signal is provided as a single-ended signal, and wherein said method further comprises providing converting said analog input signal to a differential signal.

12. A method as in claim 9, wherein said analog gain adjustment signal is provided as a differential signal.

13. A method as in claim 9, wherein said amplifying said analog input signal is performed by a four-quadrant multiplier.

* * * * *